United States Patent
Hayashi

(10) Patent No.: US 6,385,498 B1
(45) Date of Patent: *May 7, 2002

(54) MANUFACTURING METHOD FOR MICROLITHOGRAPHY APPARATUS

(75) Inventor: Yutaka Hayashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/181,042

(22) Filed: Oct. 27, 1998

Related U.S. Application Data

(63) Continuation of application No. 08/746,792, filed on Nov. 15, 1996, now Pat. No. 5,828,573.

(30) Foreign Application Priority Data

Nov. 16, 1995 (JP) ............................................. 7-298301

(51) Int. Cl.⁷ .............................................. G06F 19/00
(52) U.S. Cl. .............................. 700/121; 700/97; 703/7
(58) Field of Search ............................ 700/121, 95, 97, 700/98, 108, 109; 703/1, 2, 13, 7; 716/19, 21; 438/14; 355/53, 55

(56) References Cited

U.S. PATENT DOCUMENTS

| | | | |
|---|---|---|---|
| 4,890,239 A | 12/1989 | Ausschnitt et al. | 716/21 |
| 5,194,893 A | 3/1993 | Nishi | 355/53 |
| 5,655,110 A | 8/1997 | Krivokapic et al. | 716/19 |
| 5,663,076 A | 9/1997 | Rostoker et al. | 438/14 |
| 5,828,573 A | * 10/1998 | Hayashi | 700/121 |

FOREIGN PATENT DOCUMENTS

JP 4-277612 2/1992

OTHER PUBLICATIONS

Akutsu et al., "Acceleration Feed–back Control for Positioning Stage," *Proceedings of the 68th Regular Conference of the Japan Society of Mechanical Engineering*, vol. C, pp. 14–16 (1991).
Bruning, "Optical Imaging for Microfabrication," *J. Vac. Sci. Technol.* 17:1147–1155 (1980).
Buckley et al., "Step and Scan: A Systems Overview of a New Lithography Tool," *SPIE* 1088:424–433 (1989).
Lin, "The Paths to Subhalf–Micrometer Optical Lithography," *SPIE* 922:256–269 (1988).
Sakino et al., "Development of Ultra–Precision Positioning Stage," *Proceedings of the 69th Regular Conference of the Japan Society of Mechanical Engineering*, vol. C, pp. 11–13 (1992).

\* cited by examiner

Primary Examiner—William Grant
Assistant Examiner—Steven R. Garland
(74) Attorney, Agent, or Firm—Klarquist Sparkman LLP

(57) ABSTRACT

Methods are disclosed for decreasing the time and expense needed to design, develop, and manufacture a new or modified microlithography exposure apparatus, and for enabling the transfer precision of the various kinetic systems of the apparatus to be accurately estimated before having to actually fabricate and assemble the apparatus. The method comprises generating an overall computer-simulation model of the kinetic system of the apparatus. The model includes characteristic data (e.g., vibration transmission characteristics) of the mechanical assemblies comprising the kinetic system, the mechanical assemblies including the reticle and wafer stages as well as columns for supporting the stages. The model also includes characteristic data of the control system of the kinetic system. The model can be subjected to simulated testing and evaluation to determine the overall transfer precision of the kinetic systems, and improvements can be made to the overall model in response to the results of such testing and evaluation. After the model exhibits conformance to transfer-precision specifications, an actual apparatus according to the model can be built and evaluated.

20 Claims, 7 Drawing Sheets

MANUFACTURING METHOD FOR MICROLITHOGRAPHY APPARATUS

This is a continuation of application Ser. No. 08/746,792, filed Nov. 15, 1996 now U.S. Pat. No. 5,828,573.

FIELD OF THE INVENTION

This invention pertains to microlithography apparatus and methods, particularly for use in manufacturing semiconductor devices, liquid-crystal display devices, and the like. More specifically, the invention pertains to design and manufacture methods as applied to scanning-exposure microlithography equipment.

BACKGROUND OF THE INVENTION

Recently, as the feature sizes of semiconductor devices (e.g., memories, processors, custom integrated circuits, etc., as well as displays such in TUFT displays, etc.) have become progressively smaller, the devices themselves have generally increased in size. Generally, such devices are manufactured by processes that include at least one microlithography step.

In "projection" microlithograpy, a circuit or other feature pattern as defined on a reticle (mask) is projected, using a projection lens, onto the surface of a substrate such as a semiconductor wafer. Microlithography apparatus that perform such multiple exposures are termed "steppers" because, after each exposure at a particular site ("die") on the wafer, the apparatus "steps" to the adjacent die on the wafer (by moving the wafer relative to the reticle) for the subsequent exposure. Usually, the entire reticle pattern is formed on each die on the substrate surface. With "step-and-repeat" steppers, the entire reticle pattern is exposed at the same instant at each die; with "step-and-scan" steppers, the reticle pattern is scanned to expose each die.

In steppers, the projection lens is usually "reducing," by which is meant that the image of the reticle pattern formed on the surface of the wafer is smaller (usually by some integer factor such as four or five) than the actual reticle pattern. The projection lens can have reflective elements, a combination of reflective and refractive elements, or all refractive elements.

In many prior-art step-and-repeat steppers, the projection lens has a circular field. The size of each die thus formed on the water surface is limited by the field diameter of the projection lens. As a result, every time a change is required in the size and/or degree of feature resolution of the dies to be formed on the wafer, a new stepper is required. For example, an increase in die size with an accompanying decrease in feature size requires a stepper equipped with a projection lens having a larger projection field (field diameter) and improved resolution (greater numerical aperture).

At least with refractive-type projection lenses, an increase in field size and numerical aperture usually requires an increase in the number and diameter of the optical elements (lens elements) comprising the projection system. This causes much difficulty in the mass production of the projection lenses, especially such lenses that are operable with ultraviolet light sources. For example, projection lenses operable with excimer laser light sources such as 248-nm or 193-nm sources, with a numerical aperture (N.A.) on the substrate side of approximately 0.6 and a projection field diameter of approximately 30 mm, typically comprise at least twenty lens elements. The lens elements can include quartz lenses with diameters of about 130 to 240 mm and fluorite lenses with diameters of about 130 to 170 mm. Such elements are extremely expensive. Moreover, the mass production of large-diameter quartz and fluorite lenses is much more difficult than the manufacture of similarly sized glass lens elements. Thus, the need to design and provide a new projection lens every time there is an incremental change in device size, density, or feature size poses both prohibitive expense and difficulty for both purchasers and manufacturers of steppers.

Step-and-scan steppers as briefly described above recently have been increasingly favored because they are more flexible in accommodating changes in device size, density, or feature size without having to change the projection lens. The principle of step-and-scan systems is discussed in, e.g., *J. Vac. Sci. Technol.* 17:1147–1155, September/October 1980, in which a reducing projection lens is used with a ring-field (arc-shaped) slit. Step-and-scan can also be employed with a linear slit (part of a rectangular field) as described in, e.g., *SPIE*, vol. 922 (Optical/Laser Microlithography), pp. 256–268 (1988). A step-and-scan projection exposure device is also disclosed in Japan Kôkai Patent Publication No. HEI 4-277612, wherein the effective projection field is restricted to a linear slit extending along the diameter inside a circular field.

In the foregoing types of step-and-scan apparatus employing a reducing projection lens, the reticle (mounted on a "reticle stage") and wafer (mounted on a "wafer stage") face each other on opposing axial ends of the projection lens. The reticle and wafer must move synchronously at relative velocities that differ from each other by the projection reduction-magnification factor (e.g., ⅕ or ¼). Such coordinated movement of the stages must be extremely smooth and accurate at least during scanning and exposure.

Hence, in step-and-scan steppers (as in step-and-repeat steppers), the positioning accuracy and the stepping precision of the wafer and reticle stages are critically important for achieving "transfer precision" (i.e., faithful reproduction of the reticle pattern on each exposure area with good positional registration and feature resolution). In step-and-scan steppers, unlike step-and-repeat steppers, it is critical that the wafer and reticle stages synchronously move with extreme precision during scanning. Otherwise, transfer precision is unacceptably compromised, resulting in deterioration of image quality from, for example, line-width errors, image distortion, registration errors, and magnification errors.

Certain prior-art step-and-scan steppers as disclosed in, e.g., *SPIE*, vol. 1088 (Optical/Laser Microlithography), pp. 424–433 (1989) achieve smooth synchronous velocity control of the wafer and reticle stages by driving them with linear motors while using laser interferometers to measure the stage positions. Such control has to be achieved in an environment in which stresses and strains encountered by the stages and their drive mechanisms are always changing.

As a result, each of the mechanisms used for supporting and moving the substrate and reticle stages, as well as the column structures on which the stage mechanisms and projection optical system are mounted, must have an optimal structural design. Representative methods for performing structural analysis simulations of individual assemblies such as the reticle and substrate stages are discussed in, e.g., "Development of a High-Speed, High-Precision Positioning Stage," *Proceedings of the 69th Regular Conference of the Japan Society of Mechanical Engineering*, vol. C, pp. 11–13 (Apr. 1–3, 1992). Such methods enable one to evaluate the hypothetical properties of a proposed mechanism, such as for a stage, in isolation from other structures.

Unfortunately, a step-and-scan apparatus does not necessarily exhibit a desired transfer precision, even if the various mechanical systems for moving the stages have been optimized. This is because transfer precision is affected not only by the characteristics of the various mechanical assemblies (such as the stages), but also by other factors such as the characteristics of the various control components (e.g., drive motors and laser interferometers) that move and control motion of the stages, characteristics of columns and other supporting structures, air quality and flow inside the chamber in which these subassemblies are contained, the degree to which floor vibrations are isolated from the apparatus, and other factors. Consequently, attempts at optimization of specific assemblies and mechanisms by isolated structural-analysis simulations for each specific mechanism (e.g., vibration-mode optimization), as in the prior art, have been unsatisfactory for accurately estimating the overall transfer precision of a microlithography exposure apparatus from those simulation results.

According to prior-art design and manufacturing methods for steppers, the entire apparatus is assembled from individually optimized mechanical systems and control systems. Unfortunately, it is not possible using conventional methods to accurately determine transfer precision of an entire stepper apparatus from optimization studies performed on individual constituent assemblies. Thus, one must wait either for simulation studies performed after assembly of the entire stepper apparatus is completed or for actual test exposures using the apparatus in order to determine the overall transfer precision. Such methods typically require the construction of multiple prototypes of the apparatus and repeated testing thereof in order to finally provide a stepper apparatus that meets specifications. This requires much time in the development of a new stepper.

In addition, because design problems are inevitably discovered after completing mechanical construction of a new stepper apparatus, additional design, assembly, and testing of the apparatus to rectify deficient components results in even more time required to reach a stage at which the new apparatus can be mass produced. Furthermore, nano-order measurement accuracy is required in order to measure the performance, especially improved performance, of newly revised components or other improvements. Such extreme measurement accuracy demands large-scale facilities for obtaining reliable test data. These factors undesirably increase production costs and delays in the delivery of new microlithography exposure apparatus to customers.

SUMMARY OF THE INVENTION

Based on the foregoing, an object of the present invention is to provide design and manufacturing methods for microlithography exposure apparatus that redress the problems summarized above. Specifically, an object of the present invention is to provide such methods that decrease time and costs to develop new microlithography exposure apparatus. Another object of the present invention is to provide design and manufacturing methods that substantially decrease the risks inherent in developing microlithography exposure apparatus in which new functions have been incorporated, especially new functions for which the manufacturer has had no prior design or manufacturing experience. Yet another object is to provide design and manufacturing methods that minimize the time and labor involved in making corrections and later adjustments to the apparatus when problems are discovered during post-manufacturing evaluation of a new apparatus design.

The foregoing objects are met by methods according to the present invention. Such methods generally comprise five phases. In a first phase, a system-analysis model is generated of the kinetic mechanical system (including reticle and wafer stages as well as supporting columns) of the apparatus. The mechanical-system model is generated according to design and engineering specifications for the mechanical system. Also in the first phase, a system-analysis model of the kinetic control system (including electronics, driving motors, and interferometric sensors for controllably moving the stages relative to the column structures) for the mechanical system is generated. The control-system model is generated according to design and engineering specifications for the control system.

In a second phase, an overall system-analysis model is generated encompassing the system-analysis models of the kinetic mechanical system and the kinetic control system. The overall model preferably incorporates any refinements and/or modifications to the mechanical-system model that were made in response to the results of computer-simulated testing of the mechanical-system model.

In a third phase, the transfer precision for the overall system-analysis model is determined, particularly as affected by simulated acceleration and deceleration of the stages, simulated vibrations, and simulated disturbances and perturbations that could affect transfer precision. Such analysis is performed while considering, among other things, values for any relevant parameters such as acceleration and deceleration of the stages, vibrations at any of various locations in the apparatus, and any disturbances or perturbations that could arise from, e.g., air currents, temperature fluctuations, and the like that could degrade transfer precision.

In a fourth phase, if the transfer precision determined in the third phase does not meet a target specification for transfer precision, the design and engineering specifications for either or both the kinetic mechanical system and the kinetic control system are appropriately modified. Afterward, the first three phases are preferably repeated until the transfer precision of the overall model meets the target specification.

In a fifth phase, if the transfer precision determined in either the third or fourth phase meets the target specification, an actual microlithography apparatus is constructed according to the design and engineering specifications for the kinetic mechanical system and the kinetic control system that met the target specification for transfer precision. During the manufacture of the constituent systems, key components and assemblies can be tested and evaluated; if any such tests reveal shortcomings that could degrade performance of the apparatus, the respective model is amended and re-evaluated by re-execution of the first three phases.

According to another aspect of the present invention, a microlithography apparatus is provided for is exposing a circuit pattern defined by a mask onto a substrate. The mask is mounted to a movable first stage and the substrate is mounted to a movable second stage. The apparatus comprises a computer that is operable to perform general controlling of the apparatus and to carry outran exposure operation of the subtrate by moving the first or second stages according to a program entered into the computer by a user. The apparatus also comprises a database memory connected to the computer. The database memory is operable to store a characteristic of an overall system-analysis model that is able to simulate an exposure accuracy or a transfer precision occurring with a motion of the first or second stages and actual disturbances or perturbations encountered under actual operating conditions.

DETAILED DESCRIPTION

Figure 1:
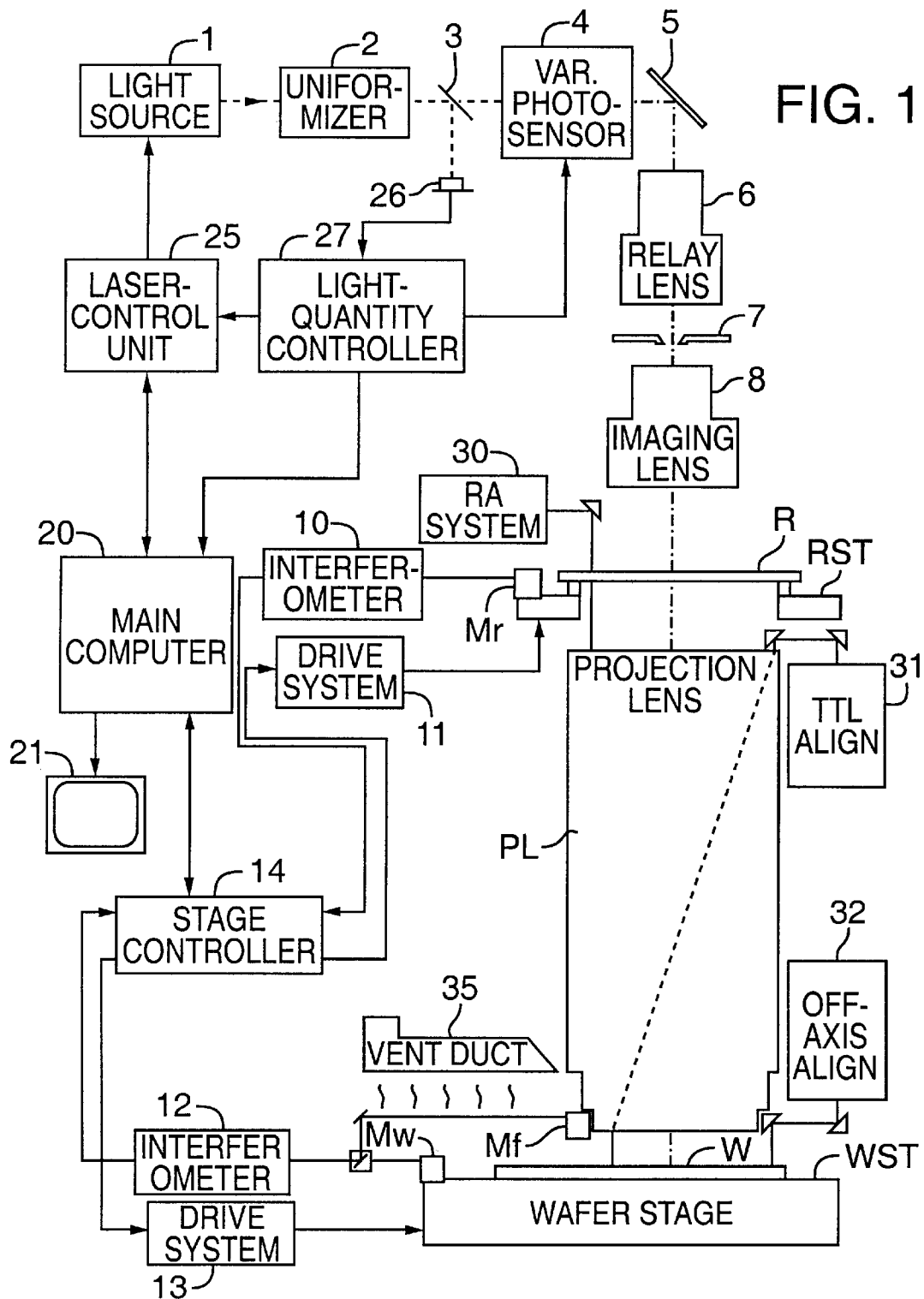
FIG. 1 is a schematic drawing of general features of a reducing projection-type microlithographic scanning exposure apparatus made by a preferred embodiment of a method according to the present invention.
Figure 2:
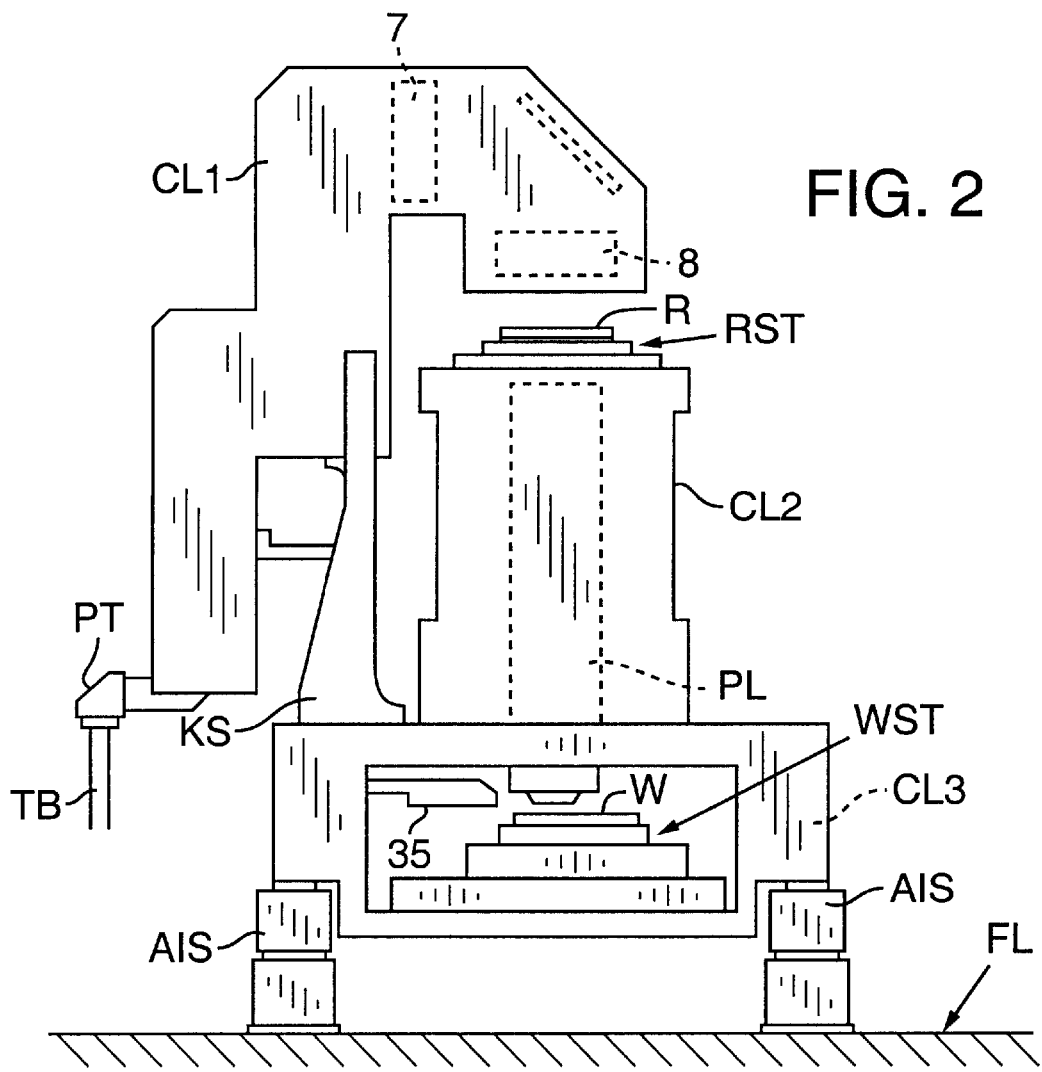
FIG. 2 is a schematic elevational drawing of the column structure of the FIG. 1 apparatus.

The present invention is directed to, inter alia, methods for designing microlithography apparatus. Referring to FIG. 1, such an apparatus comprises an irradiation subsystem 2–8 for illuminating a reticle R; a reticle stage RST operable to hold the reticle; a wafer Stage RST operable to hold a substrate (termed herein a "wafer") W having a reactive surface (e.g., coated with a photoresist) and to move the wafer in at least two dimensions (e.g. in the plane perpendicular to the plane of the page). Referring to FIG. 2, the apparatus also comprises column structures CL2, CL3 on which the reticle stage RST and the wafer stage WST, respectively, are supportively mounted. The apparatus also comprises (FIG. 1) a control system 14 and drivers 11, 13 and interferometers 10, 12 for controlling movement of the stages RST, WST, respectively; and a chamber (not shown) for enclosing at least the irradiation subsystem, the stages, the column structures, the drivers, and the interferometers in a controlled-atmosphere environment. The apparatus is operable to expose a circuit or other feature pattern, defined on the reticle, onto the reactive surface of the wafer at a desired transfer precision.

Figure 3:
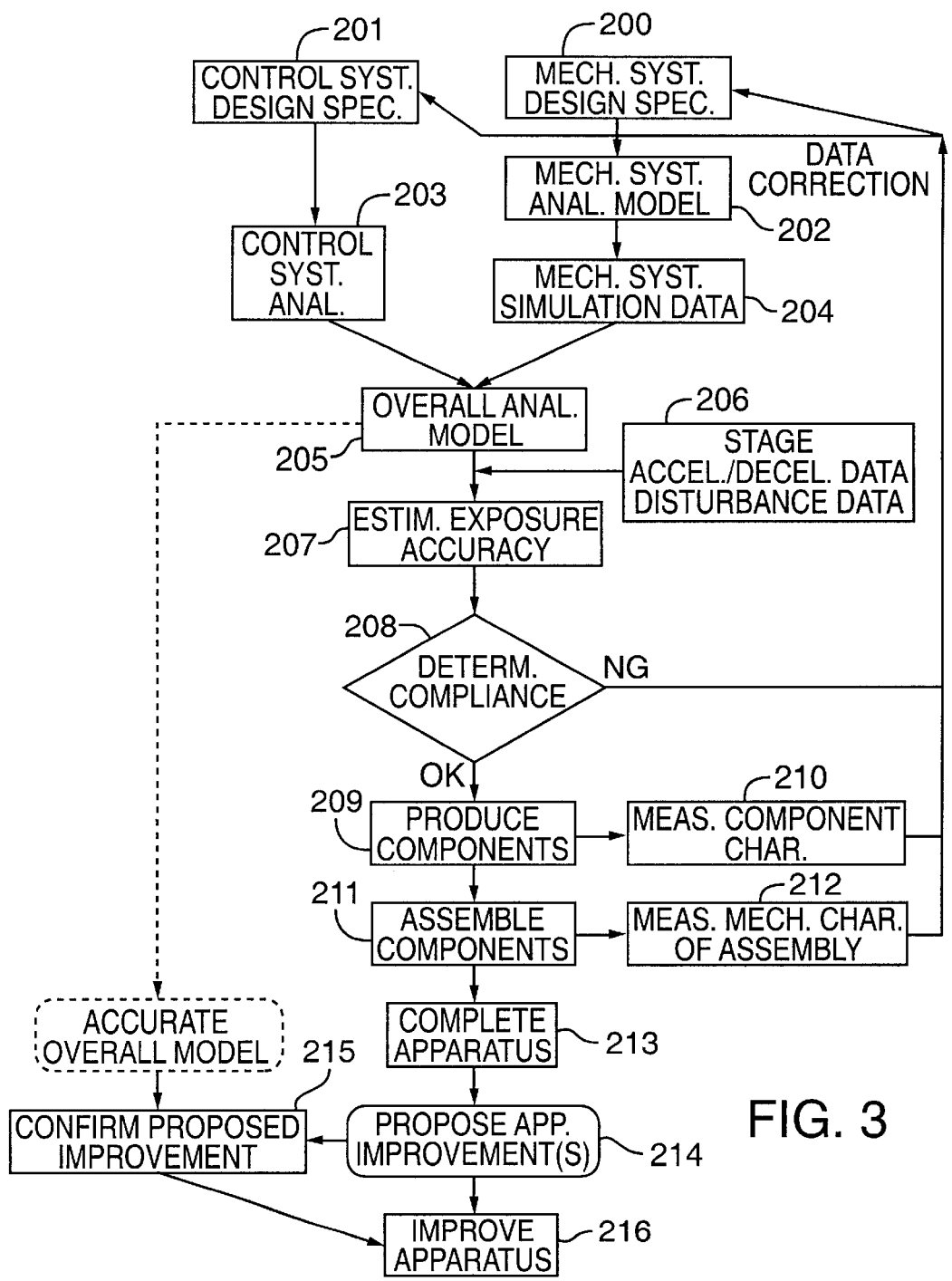
FIG. 3 is a flow chart of a design and manufacturing method according to the preferred method.

Referring to FIG. 3, a preferred embodiment of a process according to the present invention generally comprises five phases, as summarized below.

In a first phase, a system-analysis model (i.e., a computer simulation) is generated (step 202) of the mechanical system of the apparatus. The mechanical-system model encompasses models of certain mechanical assemblies such as the stages RST, WST and the column structures CL, CL2, CL3, according to design criteria, (i.e., engineering specifications; step 200) for the mechanical system. Also generated in the first phase is a system-analysis model (i.e., a computer simulation; step 203) of the electro-mechanical control system (e.g., electronics, motors, sensors, etc.) for, e.g., controlling movement of the stages relative to the column structures. The control-system model can be expressed as a signal-flow chart generated according to design criteria (i.e., engineering specifications; step 201) for the control system. The control-system model also reflects "transmission functions" pertaining to respective movements of the reticle and wafer stages.

In a second stage, (step 205) an overall system-analysis model (i.e., a computer simulation) is generated incorporating the mechanical-system and control-system models. The overall model incorporates any refinements and/or modifications to the mechanical-system model that were made in response to data (step 204) obtained from computer analysis of the mechanical-system model.

In a third phase (step 207), the overall model is analyzed by computer to ascertain for the overall model the transfer precision (exposure accuracy) by which a pattern on a reticle (held in the reticle stage) would be transferred to the surface of a wafer (situated on the wafer stage). Such analysis is performed while considering, inter alia, values for any relevant parameters such as acceleration and deceleration of the reticle and wafer stages, vibrations at any of various locations (including vibrations of a floor on which the apparatus is to be placed), and any of various disturbances and perturbations (such as effects of air currents, temperature fluctuations, and the like) that could affect the performance of the apparatus.

In a fourth phase (step 208), if the calculated transfer precision for the overall system-analysis model does not meet the design specifications, the first, second, and third phases are repeated as required to refine the overall system-analysis model until the model performs according to specifications.

Finally in a fifth phase (comprising steps 209, 211, 213), if the transfer precision of the overall model meets design specifications, an actual mechanical system and an actual control system interfaced with the mechanical system are manufactured according to the overall refined system-analysis model. During the manufacture of these systems, relevant components as well as assemblies of components are tested and evaluated (steps 210 and 212, respectively). If the outcome of such tests is favorable, an entire apparatus is constructed (step 211) and evaluated. The testing results of components and assemblies as well as of the entire apparatus are integrated into the overall model and evaluated (step 215). During testing of the complete apparatus, any shortcomings relative to design specifications, and any shortcomings revealed during analysis of the overall model, are evaluated and redressed to produce an improved apparatus (step 216).

The foregoing process permits an overall system-analysis model (step 205) to be produced and thoroughly evaluated for performance according to specifications before any hardware is made, thereby saving much time and expense in the design and development of a new microlithography apparatus. The overall model incorporates improvements to the model made in response to data obtained from evaluation of the mechanical-system model. Such data include "kinetic" data (e.g., acceleration and deceleration of the stages) and "disturbance" data (e.g., vibrations from air circulation, effects of air turbulence on interferometers, vibrations from stage drivers, expected floor vibrations, etc.) Such data are also used to refine the control-system model. Performance evaluation of the overall model provides a profile, from the kinetic data and the disturbance data, of the "transfer precision" (incorporating, e.g., changes in feature linewidth on the wafer, any image distortion as projected on the wafer, changes in magnification of the projected image, and resolution irregularities within an exposure) that would be obtained with an actual apparatus made according to the overall model.

The present invention eliminates the requirement to produce an actual prototype of a proposed microlithography apparatus in order to determine the transfer precision of the proposed apparatus design. To gain confidence in the performance of a new apparatus, the mechanical-system model, the control-system model, and the overall model are tested and evaluated using a computer. Thus, there is no need, before such confidence is obtained, to fabricate actual components and assemblies and physically test them using large-scale and expensive testing and measurement equipment. Computer evaluation of the mechanical-system model, control-system model, and overall model allows potential problems to be discovered and improvements in transfer precision to be made and evaluated without the need to perform numerous and repeated test exposures of wafers. Such computer evaluations also eliminate the need to iteratively retool each time an improvement is required in a component or assembly and the need to re-test transfer precision each time an improvement is made. These advantages greatly shorten the time to design and develop a microlithography apparatus and to make any of various proposed alterations and improvements to the apparatus.

This invention is also well suited to the design and development of improved microlithography apparatus that transfer a reticle pattern to a die on the wafer by scanning. In such apparatus, there is a high probability that the alignment between the reticle and the wafer will deteriorate due to the effects of continuous vibration encountered during scanning. This is especially so in scanning microlithography apparatus comprising a reducing projection optical system, wherein the reticle and wafer stages move at preset velocities relative to the projection optical system during each scanning exposure of a separate die on the wafer. Such apparatus tend to be more susceptible than step-and-repeat apparatus to adverse effects from vibrations arising or occurring in the various structures of the apparatus. Such vibrations can significantly degrade transfer precision unless properly controlled.

In methods according to this invention, an overall model is generated in order to, inter alia, specify conditions under which excessive vibration could arise in any of various parts of the corresponding apparatus. Thus, it becomes possible, using such an overall model, to simulate in an integrated way the vibration conditions that unavoidably arise whenever the various mechanical systems in the apparatus are moved, as well as vibration conditions that arise from disturbances caused, e.g., by air movement and temperature fluctuations inside the chamber. Such simulations enable one to evaluate the transfer precision as affected by such vibrations, and thus the transfer precision of the corresponding apparatus under actual operating conditions.

Typical Microlithography Apparatus Configuration

In FIG. 1, the various functional assemblies that comprise a typical scanning exposure for microlithography are represented in block-schematic fashion. Walls defining a chamber containing the assemblies shown in FIG. 1 are not shown to enhance clarity. Normally, such a chamber defines a space in which the atmosphere is controlled.

The apparatus of FIG. 1 comprises a light source 1 (preferably an excimer laser such as KrF or ArF) operable to provide ultraviolet exposure light. Alternatively to an excimer laser, the light source 1 can be operable to expand the spectrum width of a 1-$\mu$m wavelength laser light from a solid-state (e.g., YAG) laser light source. This would be done by phase-modulation of the laser output into several different frequencies and then directing the light into a wavelength-conversion element, thereby producing a high-frequency laser output in the 0.2-$\mu$m wavelength range. Further alternatively, the light source 1 can be a mercury-discharge lamp as is widely used in many current microlithography exposure apparatus.

Illumination light flux from the laser light source 1 passes through a uniformizer 2 (preferably comprising at least one lens and a fly-eye lens), a beam splitter 3, a variable photosensor 4 for adjusting light flux, a mirror 5, a relay lens 6, and a reticle stop 7. The uniformizer 2 distributes the irradiance uniformly over the reticle stop 7. The reticle stop 7 shapes the illumination light flux to a transverse slit or rectangular profile that illuminates the reticle R via an imaging lens 8. The imaging lens 8 forms an image of the aperture of the reticle stop 7 on the reticle R.

The image of the portion of the pattern area on the reticle R irradiated by the illumination light flux and shaped by the reticle stop 7 is projected onto the photosensitive surface of the wafer W. (By "photosensitive" is meant that the surface hag molecules that undergo a chemical reaction depending upon whether or not they are exposed to light.) For such projection, the light passes through a reducing projection lens PL. A representative projection lens PL is telecentric on both ends, has a projection magnification of ¼, has an image-side aperture number of 0.7, and has an image-side field diameter of 27 to 30 mm.

The reticle R, which is arranged on the object side of the projection lens PL, is supported by the reticle stage RST. During a scanning exposure, the reticle stage RST moves in at least one dimension (in the plane perpendicular to the plane of the page) at a constant first velocity. The wafer W, which is situated on the image side of the projection lens PL, is placed on and held by the wafer stage WST. During a scanning exposure, the wafer stage WST moves in at least one dimension (in the plane perpendicular to the plane of the page) at a constant second velocity while the reticle stage RST is moving at the constant first velocity. The wafer stage WST is typically movable in two orthogonal dimensions (in the plane perpendicular to the plane of the page).

During scanning, the position of the reticle stage RST (i.e., the displacement of the stage in a plane defined by the direction of scan and the direction perpendicular to the scanning direction, as well as by angular (rotational) displacement of the reticle stage about an axis orthogonal to the plane) is measured by a first laser interferometer system 10 utilizing a movable mirror Mr mounted to the reticle stage RST. Movement of the reticle stage RST is effected by a drive system 11 comprising a linear motor, jogging actuator, or analogous linear actuator.

During scanning, the position of the wafer stage WST (i.e., .the displacement of the stage in a plane defined by the direction of scan and the direction perpendicular to the scanning direction, as well as angular (rotational) displacement about an axis orthogonal to the plane) is measured by a second laser interferometer system 12. The second laser interferometer system 12 measures changes in distance between a reference mirror Mf attached to the projection lens PL and a movable mirror Mw mounted on the wafer stage WST. Movement of the wafer stage WST in each movement dimension is effected by a drive system 13 comprising: (a) a DC motor operable to rotate a threaded rod threadably engaged with the wafer stage; (b) a linear motor; (c) a jogging actuator; or (d) other analogous means.

A stage controller 14 comprises electronics operable to control movement of the stages. For example, the stage controller 14 comprises a reticle-side control circuit including a processor that optimally controls the drive system 11 based on measurement data from the first laser interferometer system 10, and a wafer-side control circuit including a processor that optimally controls the drive system 13 based on measurement data from the second laser interferometer system 12. Both control circuits cooperatively control the motion of the various drive systems 11, 13 so as to synchronously move the reticle R and wafer W during a scanning exposure.

A main computer 20, which performs general control of the entire exposure apparatus, exchanges commands and other information with the processors in the stage controller 14, thereby achieving exposure of the wafer W according to a program entered by the operator. For entering a program, a display-and-input unit 21 is connected to the main computer 20 to enable a user to interface with the main computer 20.

A laser-control unit 25 is included whenever the light source 1 is, for example, an excimer laser. The laser-control unit 25 is connected to the main computer 20 and controls the pulse-oscillation mode (e.g., one-pulse mode, burst mode, and stand-by mode) of the laser light source 1. The laser-control unit 25 also controls the high voltage used for discharge of the excimer Laser so as to ensure a uniform quantity of light output from the laser. A light-quantity controller 27 controls the variable photosensor 4 so as to obtain a proper amount of exposure light, and sends data signals corresponding to the intensity of the illumination light pulses to the laser-controller unit 25 and the main computer 20. Light intensity is measured by a photodetector 26, connected to the light-quantity controller 27, that receives a portion of the illumination light flux split off by the beam splitter 3.

To achieve proper registration between the reticle R and the wafer W during a scanning exposure, the FIG. 1 system further comprises a reticle-alignment system (RA system, not shown) that facilitates moving the reticle R to a desired position. A through-the-lens (TTL) aligner 31 detects positioning marks on the wafer W through the projection lens system PL, and an off-axis aligner 32 (mounted outside the projection lens system PL) detects other positioning marks on the wafer W. The TTL aligner 31 and the off-axis aligner 32 sequentially detect several marks made in a number of exposure areas on the wafer W immediately prior to exposing the wafer so as to ensure proper alignment of array coordinates of the exposure areas.

A ventilation duct 35 delivers a laminar flow of filtered, temperature- and humidity-controlled air from a direction nearly perpendicular to the light path of the measurement and/or reference beams of the second laser interferometer system 12. By thus eliminating air-temperature irregularities in the measurement and reference light paths, the ventilation duct 35 decreases accuracy-degrading fluctuations in distance measurements made by the second laser interferometer system 12. Even though not shown in FIG. 1, it is preferable that a similar ventilation duct be provided for the first laser interferometer system 10.

The components and subassemblies discussed above are mounted on corresponding column structures CL1, CL2, CL3, as shown in FIG. 2. The optical system (comprising the uniformizer 2, beam splitter 3, variable photosensor 4, mirror 5, relay system 6, stop 7, and imaging lens system 8 shown in FIG. 1) is mounted to the illumination-system column structure CL1. The reticle stage RST, projection lens PL, first laser interferometer system 10, drive system 11, a reticle-alignment (RA) system 30, TTL aligner 31, and the off-axis aligner 32 are mounted on the projection-system column structure CL2. The wafer stage WST, second laser interferometer system 12, drive system 13, and ventilation duct 35 are mounted on the base column structure CL3.

The illumination-System column structure CL1 is mounted, at about its overall center of gravity, to the base column structure CL3 by means of a support shaft KS. The projection-system column structure CL2 is also mounted to the base column structure CL3, thereby unifying the entire structure. The base column structure CL3 is then mounted to the floor FL of the installation building by means of antivibration isolation stands AIS. The antivibration isolation stands AIS prevent vibrations from the floor FL from being transferred to the column structures CL1, CL2, CL3 and prevent any tipping or swaying arising from shifts in the center of gravity of the overall structure arising from movement of heavy assemblies such as the stages RST, WST.

The illumination-system column structure CL1 includes a port PT for introducing the beam from the light source 1. The port PT is placed where any tipping or swaying of the overall structure relative to the floor FL is minimal. A mirror is situated inside the port PT and serves to reflect the beam from the laser light source 1, propagating through a vertical conduit TB (FIG. 2), for introduction into the illumination-system column structure CL1. The orientation of the conduit TB can be made horizontal by changing the mounting orientation of the port PT, thereby providing flexibility in the location and orientation of the light source 1.

In the following description, a representative composite structure of the reticle stage RST, wafer stage WST, projection-system column structure CL2, and the base column structure CL3 will be used, in the example embodiment of a method according to the present invention, as an analytical subject. Such a subject is a representative mechanical subsystem of a microlithographic exposure apparatus. Thus, the subject is used for performing a simulation, according to the present invention, of a kinetic system suitable for determining the transfer precision of a microlithography apparatus.

Structural Analysis Model of Mechanical System

Figure 4:
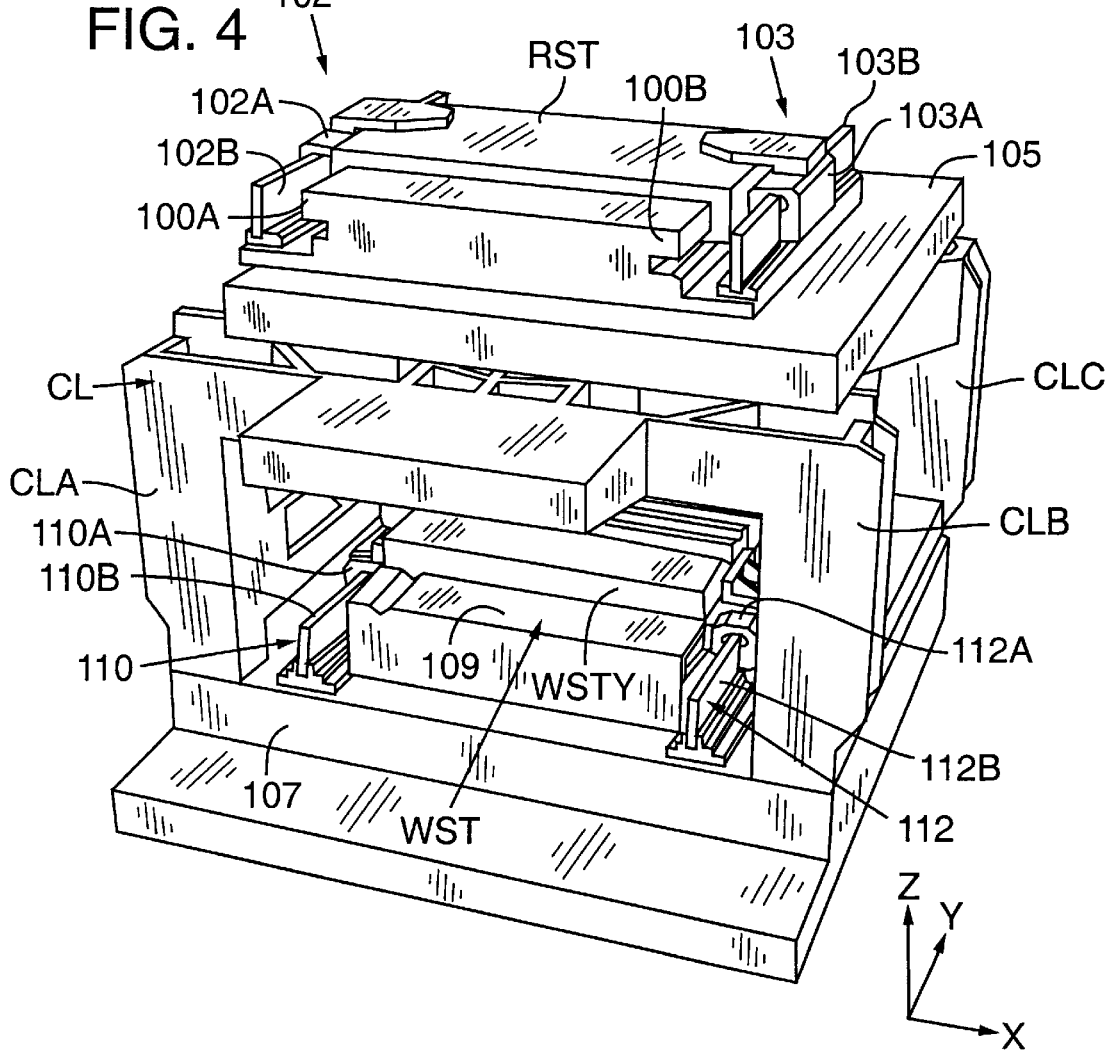
FIG. 4 is an oblique view of a representative example of an analysis model of the mechanical system of a reducing projection-type microlithographic scanning exposure apparatus according to the preferred method.

FIG. 4 is an oblique view of a representative mechanical system that can serve as the subject of a method according to this invention. The subject mechanical system of FIG. 4 comprises certain components that are similar to corresponding components shown in FIG. 2. Components of the apparatus that do not affect the simulation provided by the method have been either omitted from or modified in FIG. 4. Specifically, for example, the projection-system column structure CL2 and the base-column structure CL3 of FIG. 2 have been combined into a single column structure CL in FIG. 4.

Referring further to FIG. 4, the reticle stage RST is operable to move in the Y dimension, guided by bearings in linear guides 100A, 100B extending in the Y direction (scanning exposure direction). Movement of the reticle stage RST in the Y direction is executed by two linear motors 102 (comprising motor 102A and stator 102B), and 103 (comprising motor 103A and stator 103B) representing the drive system 11 in FIG. 1. The stators 102B, 103B are attached to a stationary base 105 on which the linear guides 100A, 100B are mounted. The stationary base 105 is mounted on top of the column structure CL. Movement of the reticle stage RST in the X direction can be achieved by including, for example, a suitable linear actuator (e.g., piezo element, piezo coil motor or mechanical push-pull mechanism); but, for clarity, such an actuator is not shown in FIG. 4.

The column structure CL comprises four support columns CLA, CLB, CLC, CLD standing at each of the four corners, respectively, of a base plate 107, as shown in FIG. 4. A foundation 109 for the wafer stage WST is mounted on top of the base plate 107 and is flanked by the four support columns CLA, CLB, CLC, CLD. The wafer stage WST comprises a Y-stage portion WSTY supported by the foundation 109 and movable in the Y dimension as guided by a linear guide. Movement of the Y-stage portion WSTY is executed by two linear motors 110 (motor 110A and stator 110B), 112 (motor 112A and stator 112B) situated on either side of the foundation 109 and representing the drive system 13 in FIG. 1. The wafer stage WST also comprises an X-stage portion (not shown) movable in the k dimension via a linear guide on top of the Y stage. Movement of the X-stage portion of the wafer stage WST can be executed by linear motors or the like, but these features are not shown in FIG. 4 for the sake of clarity.

The particular stage-drive systems used in the subject mechanical system can be selected so as to be suitable for the actual microlithography apparatus to be designed. For example, the stage-drive systems need not be linear motors, but can be, e.g., rotary-motor mechanisms that utilize lead screws. In FIG. 4, the general profile of the column structure CL resembles structures found in an actual microlithography apparatus.

Interaction Between Control System and Mechanism System

Figure 5:
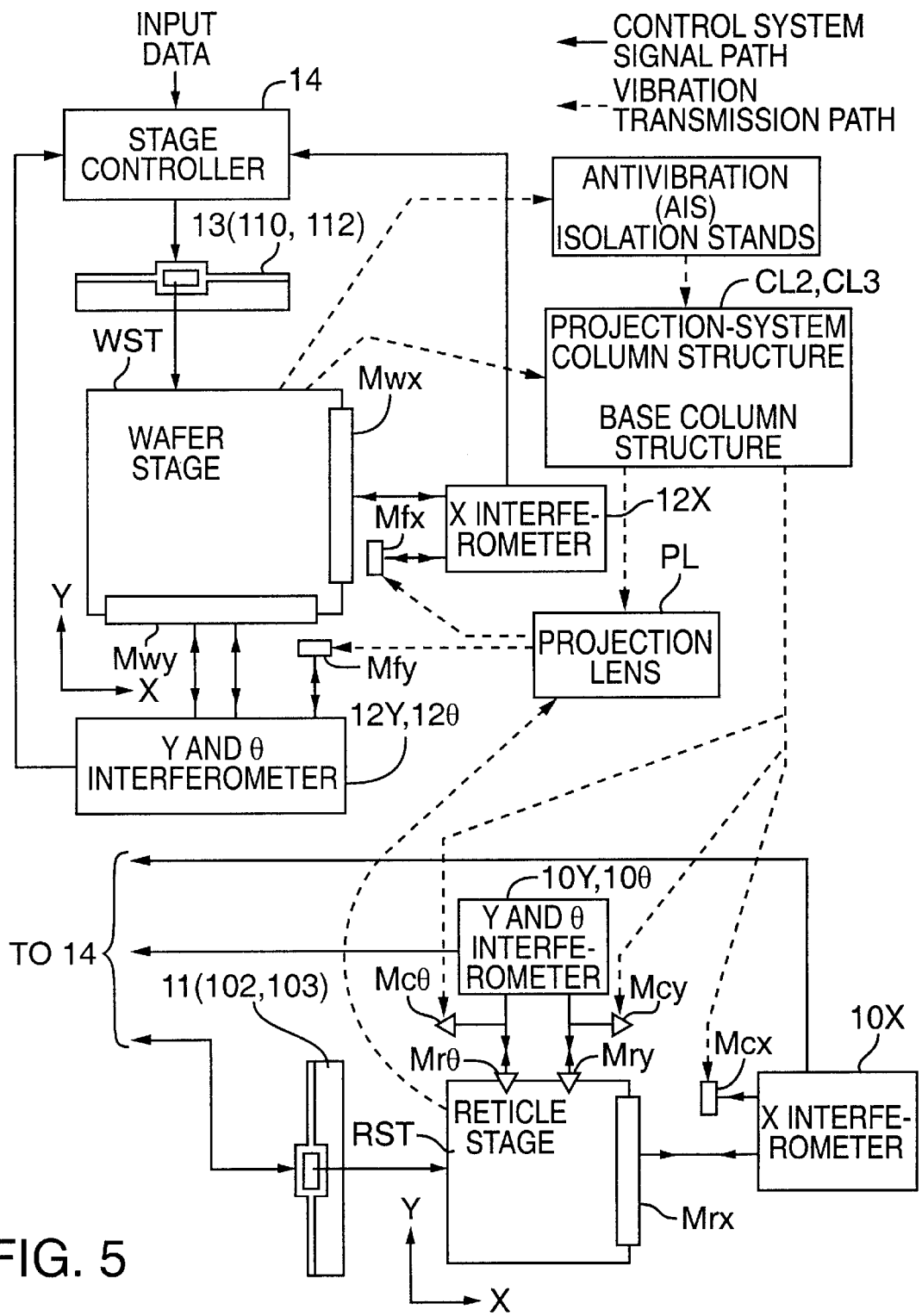
FIG. 5 is a schematic drawing depicting representative effects of vibration of the mechanical system produced when driving the various stages in the FIG. 1 apparatus.

Relationships between the assemblies of the subject mechanical system described above and a representative subject control system are shown in FIG. 5. In FIG. 5, components that are the same as in FIGS. 1, 2, and 4 have the same reference designators. Also, whereas FIG. 5 is directed to effects that arise primarily in the movement of the wafer stage WST, the same type of analysis can be applied to the other kinetic systems, such as the reticle stage, of a microlithography exposure apparatus.

In FIG. 5, data (e.g., desired target position coordinates, movement velocity, etc.) to move the wafer stage WS in, e.g., the Y direction are input to the stage controller 14. The stage controller 14 actuates the drive system 13 (comprising linear motors 110, 112). As a result, the motors 110A, 112A mounted to the wafer stage WST urge the wafer stage WST to move in the Y direction.

Such movement of the wafer stage WST also moves the movable mirrors Mwx, Mwy mounted on the wafer stage WST. The resulting displacement of the wafer stage WST in the Y direction is measured by the Y θ interferometers 12Y, 12θ, sensing light reflected from the movable mirror Mwy relative to light reflected from the reference mirror Mfy. The Y, θ interferometers 12Y, 12θ measure the position of the wafer stage WST in the Y direction by determining an average of the measured displacement values; any amount of yawing of the wafer stage WST is measured by determining any difference between the measured displacement values. Even when the stage WST is moving only in the Y direction, the X interferometer 12X measures any change in position of the movable mirror Mwx in the X direction, relative to the reference mirror Mfx. The stage controller 14 then controllably operates the drive system 13, based on the various measured displacements sensed by the Y, θ interferometers 12Y, 12θ and the X interferometer 12X, to position the wafer stage WST at the desired location for an exposure.

Whenever the drive system 13 is actuated, the wafer stage WST can experience microvibrations due to the corresponding acceleration or deceleration of the wafer stage WST. These microvibrations are transmitted to the movable mirrors Mwx, Mwy. Any reactive forces to the accelerations and decelerations of the wafer stage WST are exerted by the stators 110B, 112B of the linear motors 110, 112 on the wafer stage WST. These microvibrations and corresponding reactive forces can be transmitted to the column structures CL3, CL2 (CL in FIG. 4), yielding microvibrations in the column structures. Because the reference mirrors Mfx, Mfy are mounted to the barrel of the projection lens PL, any microvibrations of the column structures can also be transferred via the lens barrel to the reference mirrors Mfy, Mfx.

The antivibration isolation stands AIS can operate to isolate and dampen certain microvibrations when the apparatus as a whole tilts due to acceleration or deceleration of the wafer stage WST. But, microvibrations due to resilience in the antivibration isolation stands AIS can be transmitted via the column structures CL3, CL2 and the projection lens system PL to the reference mirrors Mfy, Mfx. In addition, depending on the configuration of the antivibration isolation stands AIS, microvibrations in the floor FL with a relatively high frequency component can be transmitted undamped through the antivibration isolation stands AIS to the column structures CL3, CL2. Such microvibrations also can be transmitted via the projection lens system PL to the reference mirrors Mfy, Mfx.

As can be understood from the foregoing, since the drive system 13 exerts forces on the wafer stage WST, microvibrations can originate in the integrated wafer stage WST, column structures CL2, CL3, and projection lens system PL. These microvibrations can be transmitted to the movable mirrors Mwx, Mwy and the reference mirrors Mfy, Mfx where they can result in deviations in wafer-stage positional displacement values as measured by the Y, θ interferometers 12Y, 12θ. Such microvibrations can thus degrade the precision by which the drive system 13 is servo-controlled by the stage controller 14 to achieve a desired transfer precision.

If the dynamic characteristics of the wafer stage WS, were to be simulated by a model incorporating only the electrical characteristics of the stage control unit 14 and the drive system 13, the simulation would be inaccurate because it would not include the effects of any microvibrations in the mechanical structures supporting the wafer stage. Therefore, parameters regarding transmission of such microvibrations by, and manifestation of such microvibrations in, such structures must be included in the model. An exemplary parameter is the acceleration imparted by microvibrations to the reference mirror Mfy via the column structure and the projection lens PL whenever a particular amount of force is exerted, for example, on the motors 110A, 112A.

As shown in FIG. 5, the Y-coordinate position of the reticle stage RST and any amount of rotational displacement of the reticle stage RST are measured by the Y, θ interferometers 10Y, 10θ. The X-coordinate position of the reticle stage RST is measured by the X interferometer 10X. Movable mirrors Mry, Mrθ, Mrx are attached to the reticle stage RST, and reference mirrors Mcy, Mcθ, Mcx are attached to the top of the projection lens system PL or the projection system column structure CL2. Consequently, whenever the wafer stage WST is accelerated and decelerated to move the wafer stage WST, resulting microvibrations in the column structure can be transmitted to the reference mirrors Mcy, Mcθ, Mcx. This can cause a degradation of the accuracy and precision by which the reticle stage RST is controllably moved by the drive system 11 (specifically by the linear motors 102, 103) as servo-controlled by the interferometers 10Y, 10θ, 10X. As a result, the performance of the position-control and acceleration-control servos controlling movement of the reticle stage RST for a scanning exposure is degraded due to the effects of these drive forces acting on the wafer stage WST.

Conversely, whenever accelerating or decelerating forces are imparted to the reticle stage RST by the drive system 11 during a scanning exposure, those forces also can be transmitted to the projection lens system PL (or column structure) and become manifest as microvibrations in the wafer-stage reference mirrors Mfy, Mfx. Assuming that such forces arise wherever the drive system 11 directly contacts the reticle stage, if any portions of the reticle stage RST vibrate or are damped, corresponding vibration(s) or damping(s) will be experienced, for example, by the reflective surfaces of the movable mirrors Mry, Mrθ, Mrx.

In general, from the foregoing, whenever a force is exerted at an "action point" in a subject mechanical system, there is a corresponding point(s) in the subject mechanical system that can exhibit a vibration having a significant amplitude. Therefore, in preparing a model for use in a method according to the present invention, information is incorporated specifying at what acceleration (m/s² units) other points in the mechanical system are displaced in response to a force (unit: Newtons) exerted on an "action point." An overall model of the subject mechanical system is thus prepared in which such data .are reflected in the model (e.g., a block schematic) of the respective control system.

There are any of various possible "action points" in the subject mechanical system. For example, a vibration that is generated by a force acting in one direction at a specific location on the wafer stage WST due to the drive system 13 can be transmitted at various different mode frequencies to all of the movable mirrors (Mfy, Mfx, Mcy, Mcθ, Mcx). As a result, optimum characteristic data can be prepared based on the transmission characteristics of the subject mechanical system as manifest at each individual reference mirror.

Representative Apparatus Design and Manufacturing Process

A representative process according to the present invention is diagrammed in FIG. 3. In step 202 of the process, a mechanical-system analysis model simulating a mechanical system such as shown in FIG. 4 is generated based on relevant mechanical-system engineering and design specifications 200. In addition, essentially parallel with steps 200, 202, an analysis model is generated in step 203 that simulates a control system for the mechanical-system analysis model. The control-system analysis model of step-203 is generated based on relevant control-system engineering and design specifications 201. The engineering and design specifications 201 are obtained by, inter alia: (a) designing electronic circuit configurations for the stage controller 14 to enable it to operate the drive systems 11, 13 (FIG. 1) based on data provided by the interferometer systems 10, 12 in FIG. 1 (or the various interferometer systems 10X, 10Y, 10θ, 12X, 12Y, 12θ in FIG. 5), (b) determining relevant circuit constants for various portions of the electronic circuit, and (c) preparing a control program appropriate for the characteristics of the drive systems 10, 12.

In step 203, the control-system analysis model simulates electronics hardware and software operable to receive input data from the operator as well as output data from the first and second laser interferometer systems 10, 12 in controlling movement of the drive systems 11, 13, respectively. This model is appropriate for determining how vibrations are generated and transmitted as a result of operation of an actual control system (interfaced with an actual mechanical system) corresponding to the model 203.

In step 204, data is generated from computer-simulated testing and analysis of the mechanical-system analysis model. Such testing and analysis are particularly focused on ascertaining the effects of generation and transmission of vibrations as diagrammed in FIG. 5 (dashed lines). The data obtained in such testing and analysis, as explained above relative to FIG. 5, arise primarily from vibration (resonance) generation characteristics and vibration-transmission characteristics of the mechanical system. These data reflect, inter alia, distortion and vibration of various parts of the mechanical system as generated especially by motion (acceleration and deceleration) of the stages RST, WST.

Further with respect to step 204, the testing and analysis results for the mechanical system are preferably expressed by n-order matrices each specifying accelerations that certain subject points in the mechanical system vibrate or effect damping when a certain force (e.g., 1 newton) is exerted at an action point in that structure. The order number n of the matrix corresponds to the number of vibration modes (resonance points) between the action point and another point of interest in the mechanical system. In this kind of analysis, information pertaining to vibration characteristics of the mechanical system can be expressed as any of various functions providing data on, for example, acceleration (m/s²) of one or more points in the system responding to force (Newton) applied at any of various action points.

Figure 6:
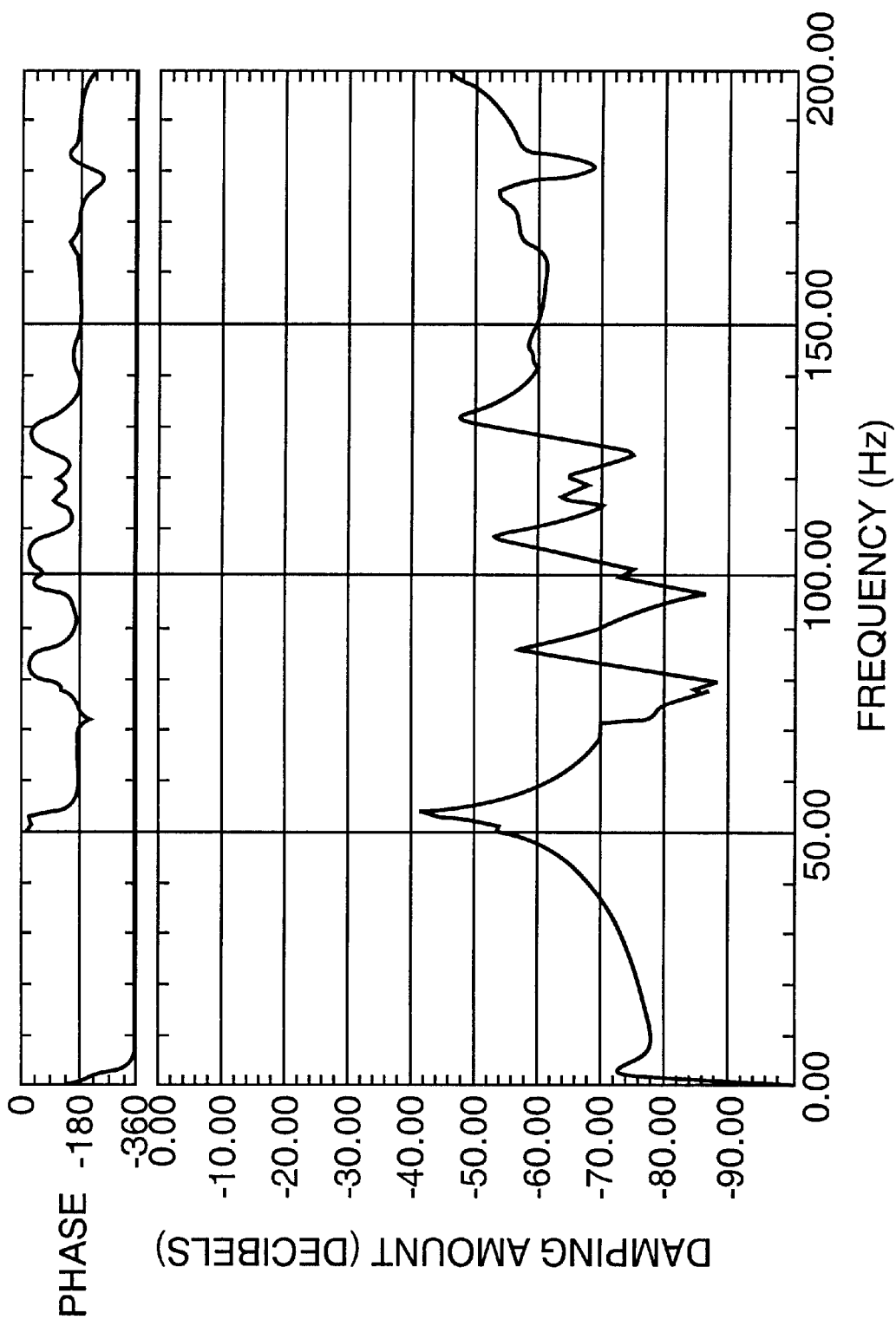
FIG. 6 is a graph of a representative vibration transmitted between specific parts of the mechanical system shown in FIG. 4.

An exemplary frequency-response curve is provided in FIG. 6, wherein the horizontal axis is vibration frequency and the vertical axes represent damping magnitude and phase. The lower graph of FIG. 6 depicts a damping magnitude (decibels) for vibration sensed at the reference mirror Mfx (which is the measurement reference position for the second laser interferometer system 12). To obtain such data, a simulated vibration-generating force, e.g., 1 N·m, is applied at an action point that would ordinarily receive an acceleration or deceleration force exerted by the drive system 12 on the wafer stage WST of a mechanical assembly of the type shown in FIG. 4. The upper graph in FIG. 6 shows phase shifts corresponding to the vibration frequencies in the lower graph under such conditions. From the data in the lower graph, it can be seen that, in a mechanical-system analysis model simulating the system of FIG. 4, there is an initial strong resonance at approximately 55 Hz (damping amount is approximately −40 dB); various other weak resonances have frequencies of approximately 87 Hz, 108 Hz, and 130 Hz.

In step 205, the control-system analysis model of step 203 and the mechanical-system analysis model of step 204 are combined to produce an overall analysis model (e.g., a computer simulation of the mechanical system shown in FIG. .4 with an accompanying control system). The overall model expresses, in the form of a block schematic of integral transmission functions, how the kinetic systems (primarily the reticle stage RST and/or wafer stage WST) will shift and be displaced in response to input data (target position instructions or acceleration/deceleration data) provided to the stage controller 14. In step 205, several different overall models can be generated (each having different candidate actuators that could be used to operate the kinetic systems). Alternatively, the overall model can be generated in a format having a number of position-command inputs corresponding to any of various types of actuators. In the latter type of model, a separate output can be produced for each actual position change of each individual "kinetic" part in the system (e.g., reticle stage and wafer stage) for each type of actuator.

Figure 7:
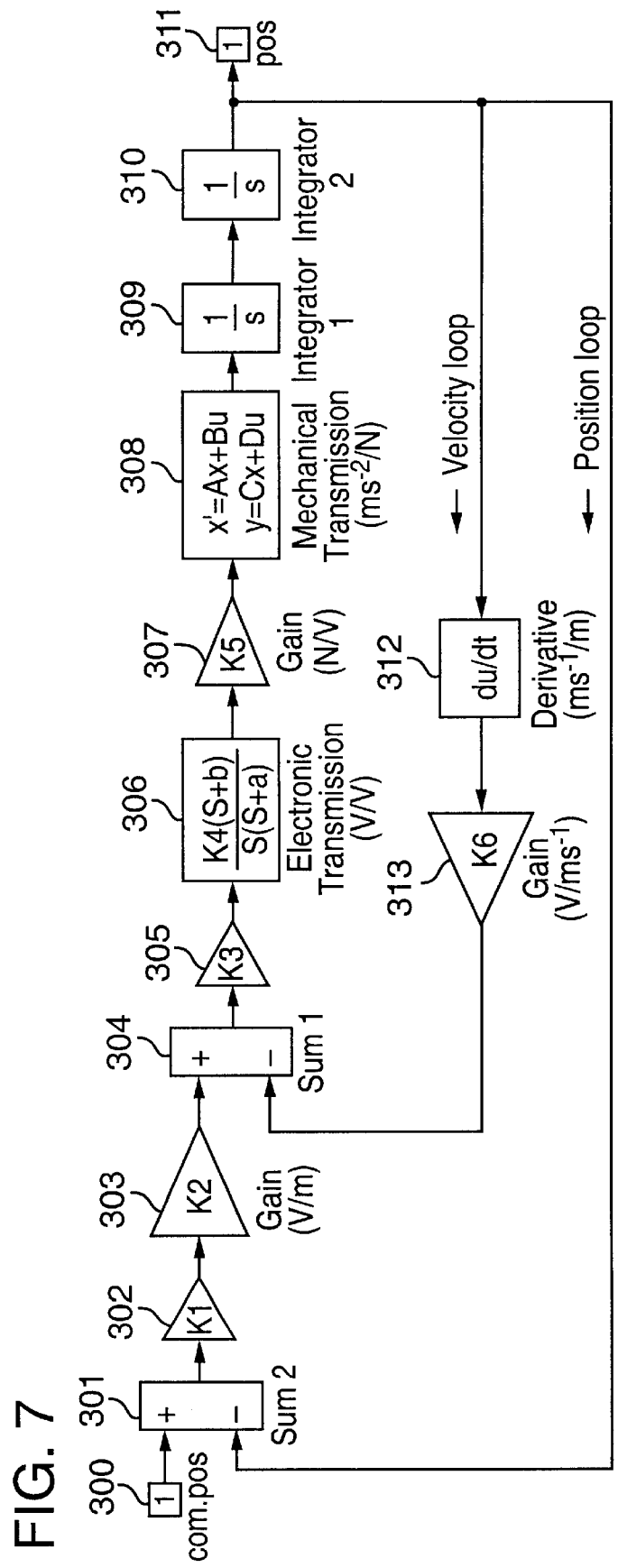
FIG. 7 is a block diagram of an example model of a kinetic system, the model incorporating both the mechanical-system model and the accompanying control-system model.

An example of an overall model representative of step 205 is shown in FIG. 7. Specifically, FIG. 7 shows an overall model simulating a one-dimensional movement of a stage (reticle stage or wafer stage). The value of a target position (com.pos) for the stage is impressed on a command-value input 300. The value of the corresponding actual position (pos.) of the stage, reached in response to the target position command, is obtained at an output 311. The position value is reflective of characteristics of an actual corresponding mechanical system including the stage.

The position-command value from the input 300 and the actual position value at the output terminal 311 (returned via a position-feedback loop) are compared by a first differential amplifier 301 that calculates a corresponding position error (in meter units). The output of the first differential amplifier 301 is amplified using a first-stage amplifier 302 to achieve a gain of K1. A second-stage amplifier 303 calculates a voltage value corresponding to the magnitude of any position error determined by the first-stage amplifier 302, and provides a gain of K2. The output from the second-stage amplifier 303 is received by a second differential amplifier 304. The second differential amplifier 304 calculates, as a voltage, any deviation between velocity data from a velocity feedback loop described below (e.g., the output from an amplifier 313) and velocity data output from the second-stage amplifier 303.

The output from the second differential amplifier 304 is amplified at a gain of K3 by an amplifier 209. The output from the amplifier 305 is input to a transmission function block 306. The transmission function block 306 operates as the control-system analysis model, and is generated by integrating, e.g., transmission characteristics of the electrical circuits inside the stage controller 14 with the transmission characteristics of the drive coils of the linear motors 110, 112 in FIG. 5. It is common for the functional expression shown inside the transmission function block 306 to be expressed using a Laplace operator S. The voltage output from the transmission function block 306 reflects the response characteristics (delay, stability, etc.) of the control system relative to the input signal.

The output from the transmission function block 306 is converted by an amplifier 307 into the value of a force (Newtons) acting on the stage from the acceleration/deceleration of the linear motor or other actuator urging movement of the stage. The gain of the amplifier 307 is K5. The output from the amplifier 307 (representing a value of agitation force) is input to a transmission function block 308 providing a simulation (step 204) of the mechanical system. The functions in the transmission function block 308 are appropriate for calculating, from the input force data, the amount of vibration (acceleration) that would be experienced at a subject point in the mechanical system. The functions are defined as multi-dimensional matrix systems. For example, certain functions can permit calculation of accelerations arising from various vibration modes acting between the reference mirrors and movable mirrors of the second laser interferometer system 12.

The functions in the transmission function block 308 of FIG. 7 also preferably include a state equation (x') and an output equation (y). Whenever the state of the mechanical system is manifest as movement of one or more rigid masses, the state can be expressed simply. Actual mechanical systems are more complicated and involve elastic properties of "rigid" bodies (such as metal components). Analysis of such systems requires an analysis of matrices having, e.g., an order number of 10 to 20. In addition, any mechanical-system parameters related to damping are first determined by rule of thumb when preparing the overall model (step 205). E.g., in the case of a mechanical system constructed only of high-rigidity metal, glass, or ceramic, etc., each parameter is determined with a damping factor of roughly 1 percent With a mechanical system including appliances such as antivibration pads and/or antivibration-isolation stands AIS, each parameter is determined with a damping factor of roughly 30 percent.

The acceleration value (for the subject point on the mechanical system) calculated as described above is converted into a velocity value by an integrator 309 (1/S as a Laplace operator). The velocity value is converted to a positional displacement (meter units) by an integrator 310. The positional displacement value is presented at the output terminal 311.

In addition, a velocity feedback loop is provided that comprises a differentiator 312 that differentiates the positional displacement data obtained at the output terminal 311 and converts it into velocity data (units of m/s). An amplifier 313 (gain=K6) converts the velocity data into a voltage value (units=V). The voltage value is conducted back to the differential amplifier 304 as a feedback signal.

When a simulation of dynamic characteristics of a mechanical system is executed as in FIG. 7, a target-position command for the stage can be impressed on the input terminal 300 according to, e.g., a step function (causing a step-wise change in stage position by a set distance). The simulation permits vibrational analysis to be performed, without having to construct an actual mechanical system, whenever the stage undergoes a position change according to the step function.

Returning to FIG. 3, after generating the overall model 205, other data (step 206) concerning, e.g., estimated floor vibrations and estimated air vibrations (including sound waves) resulting from movement of components within the chamber are input. Analysis of the overall model in the light of such data allows any relative positional shift characteristics between the reticle R and the wafer W to be calculated from the response characteristics of the stages RST, WST. Such analysis of the overall model also allows the transfer precision (exposure accuracy, step 207) to be estimated for the overall model, based on the calculated positional shift characteristics. If any measurement errors become manifest due to, e.g., undesirable perturbations inside the chamber on the first and second laser interferometer systems 10, 12, relative positional shift characteristics can be calculated that take such errors into account.

Characteristic data regarding extraneous disturbances, such as floor vibrations and/or air vibrations (e.g., sound waves) can be defined as equations of one or more variables inside the mechanical system transmission function block 308 in FIG. 7. In such a case, a simulation of stage movement can be performed with dynamic response characteristics unaltered but with the disturbance data being considered. Alternatively, overall response characteristics, simulated using stage acceleration/deceleration data without consideration of disturbance data, can be input to an overall model like that in FIG. 7.

After response characteristics as discussed above are determined for the overall model, the various behaviors (vibration, response delay, synchronization error, servo error, static positional error, etc.) that can occur during stage movement can be determined using the model, and the exposure accuracy (transfer precision) produced during scanning exposure can be confirmed from these behaviors. Particularly important parameters to consider with respect to exposure accuracy are: (a) any fluctuation in synchronization accuracy for the scanning direction (the Y direction in FIG. 4) of each stage RST, WST during scanning exposure, (b) any intra-exposure irregularities in the transfer pattern line width caused by positional fluctuations in the direction perpendicular to the scanning direction (orthogonality), and/ or (c) any distortion of the overall transfer image.

Focus stability is also preferably considered. But, since autofocus control in a stepper works on at least the wafer W side, only the focus stability (deflection in the direction of the light axis of the projection lens PL) on the reticle R side need be considered. Even so, with regard to focus stability on the wafer side, the wafer stage WST is preferably configured so that it does not vibrate at a higher frequency than the response frequency of the autofocus control system.

Further with respect to FIG. 3, it is determined in step 208 whether or not the estimated exposure accuracy as calculated from the overall model is within specification. If the exposure-accuracy specification is met, the procedure advances to the next step 209, at which the various components comprising an actual corresponding mechanical system are manufactured according to the engineering and design specifications set forth in step 200. If it is determined in step 208 that the exposure-accuracy specification is not met by the overall model, the cause(s) of deterioration in the exposure accuracy is (are) hypothesized, and appropriate changes or corrections in design values, configurations, materials, or structures in the mechanical-system analysis model and/or control-system model are made as a proposed solution to the problem. Making such "corrections" results in modified models (steps 202, 203) which are re-evaluated according to steps 204–207.

After step 209 (in which the mechanical-system components are manufactured), various characteristics (such as rigidity and/or resonance characteristics and fabrication precision) of major mechanical components that could affect overall exposure-accuracy performance are measured (step 210). Relevant components in this regard are the various guide members and guide surfaces that control freedom of movement of the stages. Such measurement data may be slightly different from and need not exactly match the corresponding engineering and design specifications set forth in step 200. Such deviations can be on the order of one wavelength or less, depending on the component.

Hence, at step 209, data regarding characteristics of the components can be substituted for the engineering and design specifications set forth in step 200, and the simulations of steps 202 through 208 can performed again to ascertain whether or not exposure accuracy has been improved or made worse. If excessive deviations in exposure accuracy are found by such analysis, several options are possible: (a) improve the fabrication precision of the components, (b) redesign certain components (e.g., change dimensions, shapes, or materials), or (c) change the overall configuration of the mechanical system.

In step 211, the manufactured components are assembled into their various assemblies. In step 212, various characteristics of the assemblies are evaluated, especially the assembly precision (e.g., squareness of guide planes set at right angles). From the results of such evaluations, the engineering and design specifications set forth in step 200 are corrected or modified, and the simulation process of steps 202–208 is repeated to make sure that the exposure accuracy has not deteriorated outside the specification.

Manufacture of the stage controller 14 based on analysis of the simulated control system can be conducted in parallel with steps 209, 210. Preferably, the actual control system is manufactured after step 212 in which it is determined that the mechanical assemblies are capable of meeting exposure-accuracy specifications. This is because various parameters of the control system (e.g., circuit constants, CPU programs for motor control etc.) may require substantial revision in order to achieve specified exposure accuracy with the mechanical components and assemblies that survive simulation analysis.

In step 213, an entire microlithography exposure device is assembled from the various mechanical-system assemblies and the control system that have passed the preceding analysis. At this point, even though the various mechanical assemblies and control system have been tested and confirmed for compliance to specifications, it is preferable that performance of the overall assembly be confirmed against specifications. This is preferably done, with the mechanical assemblies enclosed inside an actual chamber, by making test exposures of wafers using the complete apparatus. If exposure-accuracy or other problems are discovered during operation and/or while making test exposures, proposed improvements and/or upgrades can be investigated in step 214.

In step 215, the effects of any improvements implemented in step 214 are investigated using a complete apparatus as made in step 213. If such investigations indicate that the improvement(s) are effective, the process advances to step 216 in which the corresponding improvement is made to the respective components) in the mechanical system or control system. Since engineering and design specifications (steps 200, 201) for the mechanical system and/or the control system, respectively, could be significantly altered by such improvements, the overall model of the apparatus is updated and confirmed by repeating steps 202–208. All important data pertaining to the revised overall model stored on a suitable recording medium as a data base for future improvements to the apparatus.

Incidentally, characteristics of at least the main portions of the overall model can be stored in a data base of the main computer 20 of FIG. 1 (which computer performs general control of the exposure apparatus). In the event that the transfer precision of the exposure apparatus degrades during operation over a long period of time, it is thus possible to investigate the problem by directly re-simulating at the installation site the initial precision (e.g., the responsiveness of the kinetic systems, etc.) estimated for the apparatus based on the that overall model.

Furthermore, if the overall model is stored in a database of the main computer 20 of the exposure apparatus, as delivered to the customer, parameters relating to disturbances in the mechanical system (e.g., as modeled in the transmission function block 308 in FIG. 7) of the overall model can be corrected by the main computer 20. For example, such corrections can be made based on actual floor-vibration data actually measured with the exposure apparatus installed at the customer's plant. This makes it possible to perform simulations of the transfer precision that accurately reflect the disturbances actually encountered under the operating conditions in the plant.

In addition, if the exposure apparatus is designed and manufactured according to a method such as outlined in FIG. 3, whenever it is time to design a new exposure apparatus or to make improvements to an existing apparatus, it is possible to complete the design and meet performance specifications in a very short period of time without compromising the basic performance of the newly designed apparatus.

Although the foregoing design and manufacturing method is applicable especially for microlithography apparatus, such as an exposure device, it is possible to apply the method to the design, development, and manufacture of various other types of automatic measurement equipment, automatic inspection equipment, or precision fabrication equipment that employ a movable mechanism for positioning a workpiece such as a wafer or glass substrate, etc., with high speed and precision.

The present invention facilitates the accurate investigation of dynamic characteristics associated with how moving objects in a process or measurement device respond to acceleration and deceleration forces. The invention also facilitates study of the dynamic characteristics obtained when accelerations and decelerations (including disturbance data, as required) of a moving object are imposed under actual control conditions. It is now possible, without having to construct an actual apparatus, to accurately estimate and investigate the performance characteristics (e.g., positioning accuracy, static accuracy, velocity accuracy, throughput, etc.) of the apparatus, especially apparatus that require precise positioning and/or velocity control of a workpiece using a feedback control employing an interferometer system.

By preparing an overall model of a microlithography apparatus as described above, incorporating an analysis model of a mechanical system and an accompanying control system, and by imposing the kinetic aspects of the mechanical system and disturbance data on that model, it is now possible to accurately and quickly estimate the performance of the apparatus. Such performance estimates include the transfer precision and/or control accuracy of the mechanical system. This enables the pre-manufacture prototype period or improvement period to be substantially shortened. Furthermore, even when the goal is to design and develop an apparatus that includes a new functions) for which there is absolutely no background information or experience, it is now possible to substantially diminish adverse risks of development since the performance of the equipment can be readily estimated before encountering the high expense of constructing and verifying a prototype.

Even when faced with the need to correct performance problems encountered after the subject apparatus has been completely designed and manufactured, the properties of the apparatus can be evaluated using the process of the present invention in a short period of time without always having to produce multiple prototypes of proposed improvements in the process of troubleshooting. This makes it possible to respond rapidly even to demands from the user of the apparatus. This in turn enables costs associated with such improvements to be decreased.

Whereas the invention has been described in connection with preferred embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A method for manufacturing an exposure apparatus that exposes a second object with an energy beam irradiated on a first object, the method comprising:
  (a) determining an overall characteristics model of an operational system of the exposure apparatus based on characteristics data of a mechanical system of the exposure apparatus, the mechanical system including a movable body disposed in the exposure apparatus and a structure on which the movable body is mounted, the overall characteristics model corresponding with data pertaining to a displacement of the mechanical system caused by data input to a control system connected to the mechanical system; and
  (b) computing a transfer precision with which a pattern on the first object is transferred onto the second object according to the overall characteristics model, relative to design specifications of the mechanical system and the control system used in determining the overall characteristics model.

2. The method of claim 1, wherein the data pertaining to the displacement includes any of acceleration, velocity, and/or position of the mechanical system.

3. The method of claim 1, wherein command data for moving the movable body are added to the overall characteristics model in order to compute the transfer precision.

4. The method of claim 3, wherein data regarding disturbances exerted on the mechanical system or on the control system are added to the overall characteristics model in order to compute the transfer precision.

5. The method of claim 1, further comprising the step, after step (b), of judging a necessity for correcting at least one of the design specifications based on the computed transfer precision.

6. The method of claim 1, wherein the characteristics data are determined according to vibration characteristics or propagation characteristics to which is added vibration or distortion of the mechanical system caused by movement of the movable body.

7. The method of claim 1, wherein the characteristics data include an n-order matrix that specifies acceleration at an observation point other than an excitation point caused by force exerted at the excitation point in the mechanical system.

8. The method of claim 7, wherein an order n of the n-order matrix corresponds with a number of vibration modes in the mechanical system between the excitation point and the observation point.

9. The method of claim 1, wherein the overall characteristics model is determined with the characteristics data reflected in a characteristics model of the control system, the characteristics model of the control system being determined from a circuit configuration of the control system.

10. The method of claim 1, wherein a damping ratio of the mechanical system is determined in advance and the characteristics data are prepared or revised based on the damping ratio.

11. The method of claim 1, wherein the structure and the control system are manufactured according to design data for the mechanical system and the control system that have the computed transfer precision to reach a target value.

12. The method of claim 1, further comprising the steps, after step (b), of:

measuring structural characteristics of one or more components made during manufacture of the structure, or structural characteristics of a mechanism that incorporates multiple components made during the process; and correcting the overall characteristics and confirming the computed transfer precision from the corrected overall characteristics model.

13. An exposure apparatus that exposes a second object with an energy beam irradiated on a first object, the apparatus comprising:

(a) a mechanical system comprising a structure on which a movable object is mounted;

(b) a control system connected to the mechanical system; and (c) a computer to which a database memory is connected, the memory storing characteristics data for an overall characteristics model of an operational system of the exposure apparatus, the data being recallable from the memory by the computer for computing a transfer precision with which a pattern on the first object is transferred onto the second object according to the overall characteristics model, the overall characteristics model being determined from characteristics data of the mechanical system based on design specifications of the mechanical system and the control system according to a relationship between data that are input to the control system and data pertaining to a displacement of the mechanical system caused by the input data.

14. The apparatus of claim 13, further comprising a projection system that projects the energy beam onto the second object, wherein the first object is disposed on an object plane side, and the second object is disposed on an image plane side of the projection system.

15. The apparatus of claim 14, wherein the movable object comprises a first stage that holds the second object on the image plane side of the projection system.

16. The apparatus of claim 15, wherein the movable object comprises a second stage, situated apart from the first stage, that holds the first object on the object plane side of the projection system.

17. The apparatus of claim 16, wherein the structure comprises a base on which the movable object is disposed, and a vibration-isolation mechanism on which the base is mounted.

18. The apparatus of claim 17, wherein the structure comprises a column on which the projection system is mounted.

19. The apparatus of claim 18, wherein the structure comprises a column on which is mounted at least part of an illumination system that irradiates the energy beam onto the first object.

20. The apparatus of claim 19, wherein the control system comprises a scanning system that controls relative movements of the first and second objects relative to the energy beam during scanning exposure of the second object.

* * * * *

UNITED STATES PATENT AND TRADEMARK OFFICE
CERTIFICATE OF CORRECTION

PATENT NO.   : 6,385,498 B1
DATED        : May 7, 2002
INVENTOR(S)  : Yutaka Hayashi It is certified that error appears in the above-identified patent and that said Letters Patent is hereby corrected as shown below:

Column 1,
Line 19, "such in" should be -- such as --.
Line 46, "water" should be -- wafer --.

Column 4,
Line 53, "for is exposing" should be -- for exposing --.
Line 58, "outran" should be -- out an --.

Column 5,
Line 15, "method," should be -- method --.
Line 37, "Stage RST" should be -- stage WST --.

Column 6,
Line 34, "Finally" should be -- Finally, --.

Column 8,
Line 25, "hag" should be -- has --.

Column 11,
Line 32, "resembles sturctures" should be -- resembles such structures --.
Line 57, "Y $\theta$" should be -- Y, $\theta$ --.

Column 13,
Line 36, ".are" should be -- are --.

Column 14,
Line 50, "system 12" should be -- system 13 --.

UNITED STATES PATENT AND TRADEMARK OFFICE
CERTIFICATE OF CORRECTION

PATENT NO. : 6,385,498 B1
DATED : May 7, 2002
INVENTOR(S) : Yutaka Hayashi

It is certified that error appears in the above-identified patent and that said Letters Patent is hereby corrected as shown below:

Column 15,
Line 40, "209" should be -- 305 --.

Column 16,
Line 17, "1 percent" should be -- 1 percent. --.

Signed and Sealed this

Twenty-ninth Day of July, 2003

JAMES E. ROGAN
*Director of the United States Patent and Trademark Office*